United States Patent [19]

Wessells et al.

[11] 4,042,996
[45] Aug. 23, 1977

[54] AIR ETCHING OF POLYMERIC PRINTING PLATES

[75] Inventors: Forrest A. Wessells, Baltimore; John E. Pickard, Ellicott City, both of Md.

[73] Assignee: W. R. Grace & Co., New York, N.Y.

[21] Appl. No.: 590,349

[22] Filed: June 25, 1975

Related U.S. Application Data

[63] Continuation-in-part of Ser. No. 388,234, Aug. 14, 1973, Pat. No. 3,922,751, which is a continuation-in-part of Ser. No. 351,415, April 16, 1973, abandoned, which is a continuation-in-part of Ser. No. 316,253, Dec. 18, 1972, abandoned, which is a continuation-in-part of Ser. No. 178,723, Sept. 8, 1971, abandoned.

[51] Int. Cl.² .............................................. A47L 5/38
[52] U.S. Cl. ................................... 15/306 R; 15/303; 15/312 R; 15/316 R
[58] Field of Search ................... 15/301, 303, 306 R, 15/306 A, 306 B, 308, 312 R, 316 R, 345, 346, 405, 310

[56] References Cited

U.S. PATENT DOCUMENTS

| 932,738 | 8/1909 | Wilson ............................. 15/405 X |
| 1,899,704 | 2/1933 | Lutz ................................. 15/345 X |
| 2,566,142 | 8/1951 | Powers, Sr. .................... 15/306 R X |
| 2,766,720 | 10/1956 | Muller et al. ................... 15/306 A X |
| 2,999,262 | 9/1961 | Jenkins et al. ..................... 15/345 X |
| 3,114,482 | 12/1963 | Dunaway ............................. 222/328 |
| 3,120,806 | 2/1964 | Supernowicz ....................... 101/426 |
| 3,264,103 | 8/1966 | Cohen et al. ............................ 96/28 |
| 3,615,450 | 10/1971 | Wszelek et al. ....................... 96/35.1 |
| 3,849,831 | 11/1974 | DeVerter et al. ............. 15/316 R X |

FOREIGN PATENT DOCUMENTS

794,995  5/1958  United Kingdom

OTHER PUBLICATIONS

"Waldron Microjet Air–Knife Coater", Bulletin No. MJC–66, Waldron–Hartig Div., Midland–Ross Corp., New Brunswick, N.J. 1966.

*Primary Examiner*—Christopher K. Moore
*Attorney, Agent, or Firm*—Charles L. Harness

[57] ABSTRACT

This invention is directed to an apparatus for developing printing plates by stripping away uncured material using a carefully controlled gas stream. An optional supplemental blotting system is provided.

11 Claims, 13 Drawing Figures

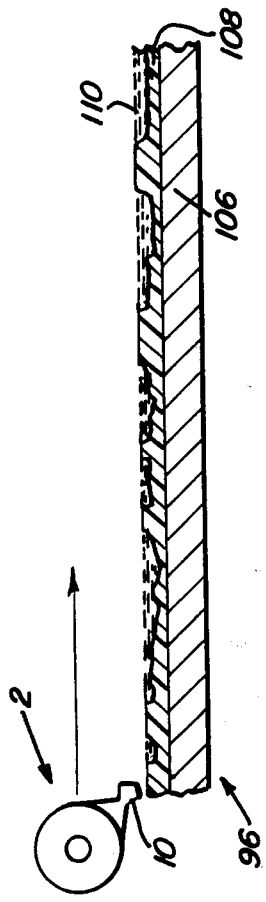
FIG.3
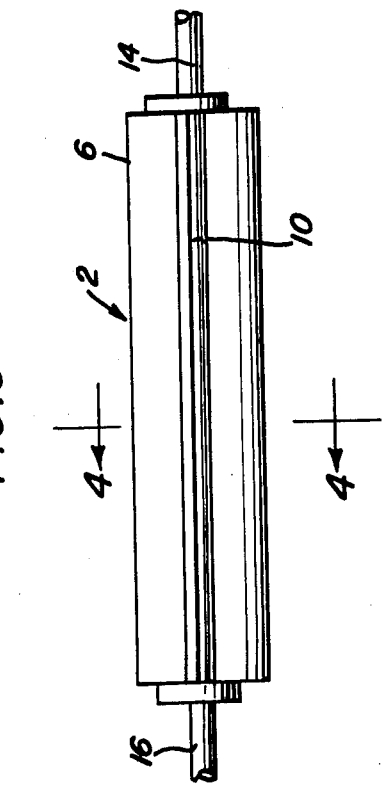
FIG.5
FIG.6
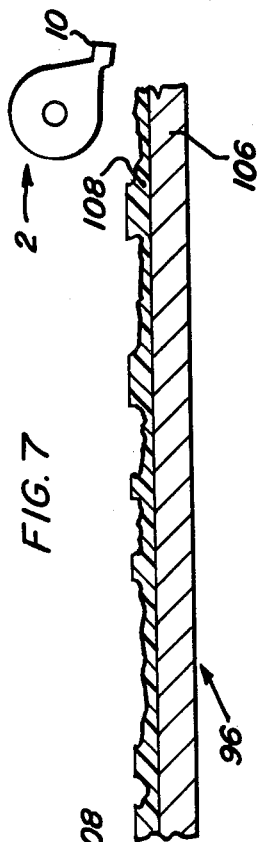
FIG.7
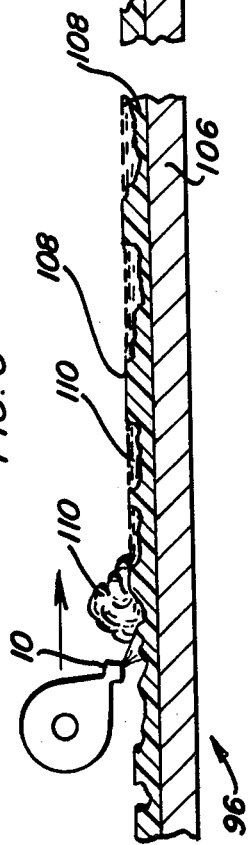

AIR ETCHING OF POLYMERIC PRINTING PLATES

This case is a C.I.P. of U.S. Ser. No. 388,234, Aug. 14, 1973, now U.S. Pat. No. 3,922,751, issued Dec. 2, 1975, which is a C.I.P. of U.S. Ser. No. 351,415, filed Apr. 16, 1973 (now abandoned), which is a C.I.P. of U.S. Ser. No. 316,253, filed Dec. 18, 1972 (now abandoned), which is a C.I.P. of U.S. Ser. No. 178,723, filed Sept. 8, 1971 (now abandoned).

This invention relates to an apparatus of preparing a printing plate by selectively exposing to actinic radiation a liquid photopolymer composition, following which the photocurable liquid polymer composition is seletively hardened or cured by actinic light, after which the resulting plate is passed under a carefully controlled stream of air for removal of most of the remaining liquid polymer.

In the printing art, where time is of the essence, preparation of relief printing plates usually made of zinc or magnesium metal by photoengraving requires relatively long etching periods until sufficient relief is obtained on the metal plate. Recently the art has discovered that polymeric materials may be substituted for metals in the formation of printing plates. However, even with polymeric materials in which images are formed usually by photopolymerization or photocuring, it is desirable to shorten the time necessary to develop or etch the plate (e.g., in a solvent or an aqueous solution). In addition, it is necessary to aid the etching mechanically by removal of the unpolymerized or uncured portion of the materials with a spray, brush, blotter, sponge or other mechanical means, or by an ultra-sonic etching. Such means, relying on physical contact, cause image surface or edge distortion and the total removal of all the non-image polymeric material is difficult. A further drawback to the etching systems for photopolymerizable or photocurable plate materials which use a solvent system is the flammability and toxicity of the solvent and the possible harm that may result to the person handling such systems over relatively long periods of time required to etch to a commercially acceptable degree. The instant system is also advantageous in that the excess polymer can be collected, hardened with ultra-violet light, and disposed of as solid waste.

It has now been found that by practice of the present invention there is provided a method for development, using a carefully controlled air stream, of a printing plate after selectively exposing to actinic radiation, a liquid photopolymer composition. Generally stated, the present method for preparing a printing plate includes forming a liquid photocurable composition; disposing said liquid photocurable composition as a substantially uniform layer onto a support sheet; forming a printing plate by exposing the light photocurable composition to actinic light through an image-bearing transparency consisting solely of substantially opaque and substantially transparent areas until substantially complete photocuring takes place in the exposed areas and substantialy no photocuring takes place in the nonexposed areas; and stripping the printing plate having substantially complete photocured areas and substanially non-photocured liquid areas by using a carefully controlled stream of air.

Practice of the present invention will become more apparent from the following detailed description taken in conjunction with the drawings.

In the drawings,

FIG. 3 shows the air knife in side elevation, and

FIG. 4 shows the air knife in a section taken across 4—4 in FIG. 3.

FIG. 5 illustrates as a partial side elevational view a selectively photocured printing plate including areas of uncured liquid composition.

FIG. 6 illustrates as a partial side elevational view a printing plate having uncured areas being removed by a carefully directed stream of air.

FIG. 7 illustrates a developed printing plate.

Figure 1:
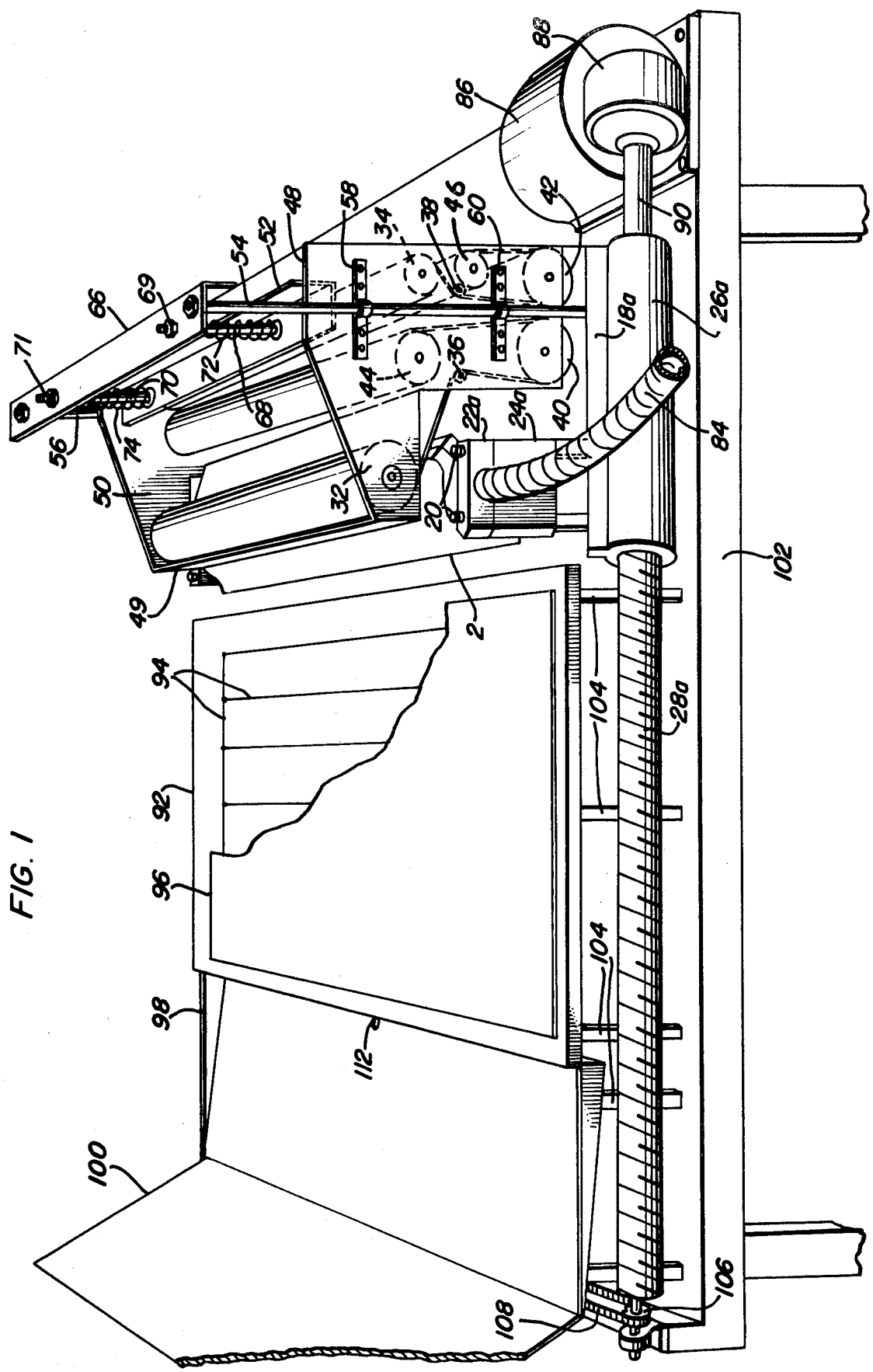
FIG. 1 shows the complete assembly of a preferred embodiment of this invention in perspective.

Starting with FIGS. 3 and 4, the structure of the air knife is explained as follows. It will be noted that the air knife (shown generally at 2) is in essence a hollow cylinder. In practice, this cylinder is conveniently formed from two (2) semi-cylindrical castings 2-a and 2-b, as shown particularly in FIG. 4. In FIG. 4, a plurality of bolts 4 pass through a flange 6, and hold these two parts of the air knife cylinder 2 together. Additional strength in the assembly is achieved by means of additional bolts 8 which fasten the two halves 2-a and 2-b of the air knife cylinder 2 transversely through the center. The tip of the air knife is shown generally at 10. The two halves of the tip 10 do not come together completely. A space between them, 12, must be left to permit egress of air. It is this flow of air which provides the air knife effect. To accomplish this, air is forced into at least one end of the air knife, e.g., at 14, through air hose 84 or the like (see FIG. 1). Suitably, an air hose is also connected to the other side of the air knife, at 16.

Figure 2:
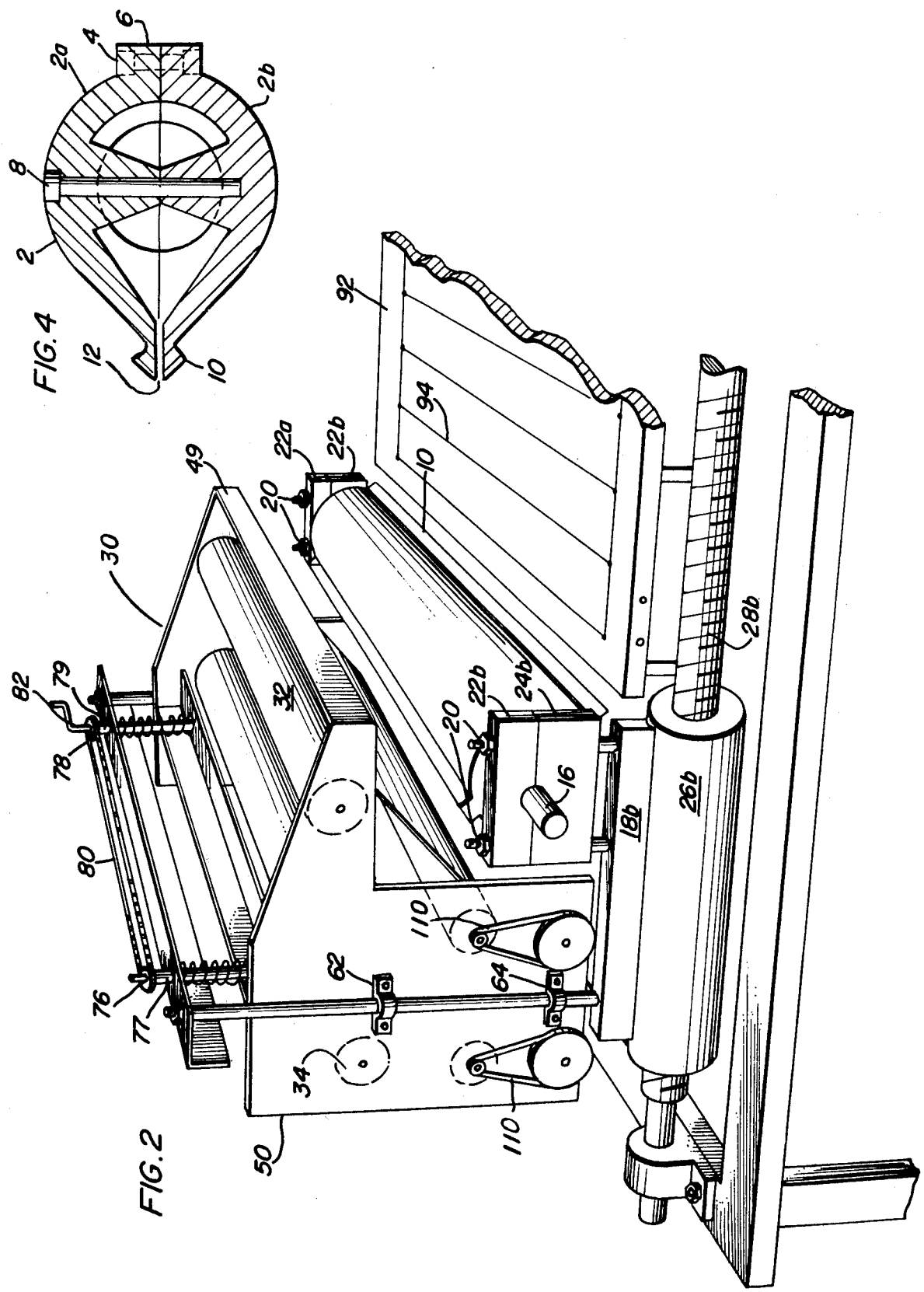
FIG. 2 shows the obverse side of the assembly of FIG. 1, omitting certain portions.

Turning now to FIGS. 1 and 2, the air knife 2 is fastened to substructures 18a and 18b by means of bolts 20, operating through lock systems 22a and 24a, and 22b and 24b respectively. Substructures 18a and 18b are mounted on sleeves 26a and 26b respectively, which are grooved to be operated by worm gears 28a and 28b respectively. The latter structure will be explained below. Also supported by substructures 18a–18b is the blotting assembly denoted generally by 30. This blotting assembly contains two sets of blotting rolls comprising generally feed rolls 32 and 34, take-up rods 36 and 38, pressure rolls 40 and 42 and wind-up rolls 44 and 46. All of these rolls are positioned within journals in face plates 48 and 50. Face plates 48 and 50 are connected together by welded angle iron 52 and by welded front panel 49. Rods 54 and 56 are fastened to substructures 18a and 18b respectively. Rods 54 and 56 are likewise attached slidably to face plates 48 and 50 via brackets 58 and 60 on face place 48 and 62 and 64 on face plate 50. The tops of the rods 54 and 56 are respectively fastened to angle iron 66. Angle iron 66 is resiliently fastened to angle iron 52 via bolts 68 and 70 and springs 72 and 74. The purpose of this arrangement is that in operation, when rolls 40 and 42 are passing over the platen 92, the pressure on the platen can be adjusted by tightening (or loosening) the bolts 68 and 70. This tightening (or loosening) arrangement may be done simply by tightening each bolt 68 and 70 via nuts 68 and 71 respectively, or it may be done by connecting both bolts by sprockets 76 and 78, and connecting said sprockets by sprocket chain 80, which is actuated by crank 82. Sprockets 76 and 78 are threaded, and, when turned, bear on sleeves 77 and 79 respectively, thereby applying pressure to (or releasing pressure from) angle bar 66, and hence acting on rolls 40 and 42. The latter arrangement (via crank) is shown best in FIG. 2, whereas the former nut-and-bolt arrangement is shown in FIG. 1. The crank arrangement (FIG. 2) is used when it is desired to raise the blotting assembly (from the letterpress plate, after blotting) before returning the blotting assembly to its starting position. The semi-fixed nut-and-bolt arrangement of FIG. 1 is best used in an arrangement in which the air knife and blotting assembly is passed over the letter-press plate, and then the plate is pulled out from the assembly (from behind) before returning the assembly. In each of these two cases the pressure rolls 40 and 42 will be disengaged from further frictional contact with the letterpress plate and will not turn on their journey back to the starting position.

Rolls 40 and 42 are formed of any resilient material, e.g., neoprene, polyurethane, elastomers generally, rubber, rigid vinyl pipe (polyvinyl chloride type). Preferably the material is one having a Shore A hardness in the range of 10 to 50, with about 20 being the preferred hardness. Neoprene is the preferred material.

Air hose 84 is connected to air inlet 14 of the air knife. A similar air hose may be connected to an opposite air inlet 16 on the other side of the air knife, although this is not strictly necessary.

Turning now to FIG. 1, it will be noted that worm gear 28a is driven by motor 86 via gear reducer 88, thereby operating shaft 90. The pitch of the worm gears 28a and 28b is about 4 to the inch, and of coure the sleeves 26a and 26b have exactly the same internal gear pitch. Spur gear 106 on worm gear 28a drives an identical spur gear (not shown) on worm gear 28b via chain 108, so as to move sleeve 28b at the same rate of speed as sleeve 28a.

Turning now to platen 92, shown best in FIG. 1, it will be noted that its transverse dimensions are slightly broader than those of the air knife 2 and blotting assembly 30. The platen 92 is suitably formed of rigid dimensionally stable material, e.g., cast aluminum. Size is not critical; but in this particular example, its dimensions were 19 by 26 inches. Preferably, the platen is covered lightly by a grid of indentations 94, leading to a vacuum outlet (not shown). These indentations 94, when activated by the reduced pressure of the vacuum outlet hold the letter-press plate (shown partly cut away at 96) closely to the platen. Note that the air knife is longer than the width of the letter-press plate, so that all the excess polymer will be caught. Referring again to FIG. 1, at the left of the assembly is shown collection pan or sink 98 and spatter plate 100. Hole 112 in sink 98 drains off collected polymer.

As shown in FIG. 1, the entire assembly is mounted on a frame 102, via supports 104.

Referring to FIG. 2, it will be noted that each of the roll pairs 40-44, and 42-46, are equipped with sprockets and chains shown generally at 110 and 110, which drive their respective rolls through slipping clutches, not shown. This system insures that the "used" blotting paper will be kept rolled up tightly on take-up rolls 44 and 46.

FIG. 5 illustrates plate 96 in magnified section having backing 106, and layered thereon is a photocurable composition having cured areas 108 and uncured liquid photocurable composition 110.

FIG. 6 shows the air knife 2 advancing across the plate 96 and blowing ahead of it uncured polymer 110.

FIG. 7 shows plate 96 after completion of the blowing operation.

EXAMPLE 1

OPERATION OF THE INVENTION

First it is necessary to process a letter-press plate of the type that uses a liquid or liquefiable photopolymer. Such polymers have been described in great detail in patents owned by the assignee of the instant application, e.g., U.S. Pat. No. 3,661,744, Kehr et al., issued May 9, 1972.

Examples of specific suitable photopolymers and their use in plate making are given below as Examples 2 and 3.

In processing the plate, it is necessary to go through the following steps:

1. Liquid photopolymer is spread out on a substrate to form a thin film.
2. This film of photopolymer on the substrate is then exposed to ultraviolet light through an image, e.g., a photographic transparency. At this point, following procedures of a prior art, the uncured polymer would be removed, typically in an etching bath. In this invention, however, it is removed by the air knife and blotting system herein described.

A convenient method of carrying out this invention is to place an image-bearing, line or halftone, stencil or positive or negative transparency parallel to the surface of a layer of a photocurable (i.e., a photohardenable, photocrosslinkable, or photopolymerizable) composition ("photopolymer") which has been cast directly on a support. The image-bearing transparency and the surface of the composition may be in contact or have an air gap there between, as desired. The photocurable layer is exposed through the transparency to a source of actinic light, preferably a point or collimated light source, until the layer is cured or polymerized to an insoluble stage in the exposed areas. The thickness of the ultimate relief in such a method may be controlled by varying the thickness of the layer of the composition. The plate is then exposed to a stream of air from an air knife to a degree necessary to remove uncured polymer, and following this, the plate is given a UV-post exposure of about one minute. Thereafter, the photocured printing plate is ready for use in printing, i.e., as a relief printing plate, and as described in U.S. Pat. No. 3,666,461, as a pattern to make other plates.

More specifically, following ultraviolet imaging exposure, the letterpress printing plate is placed on platen 92 (see FIG. 1), and fixed thereto by operation of the vacuum system 94. The air knife assembly is then activated. To do this, air pressure is introduced into hose 84 and motor 86 is turned on. This has the effect that the entire air knife assembly moves slowly across the platen. The air pressure from the air knife blows in front of it substantially all the uncured polymer now remaining in the letter-press plate, leaving behind cured polymer in the relief pattern of the original image. Blotting paper rolls 40 and 42 press against the relief parts of the plate, and thereby absorb or remove any residual polymer remaining on the printing surfaces, in the shadow tone areas of half-tones, closed bowls of small letters, and other shallow relief areas which may not be completely cleaned out by the air knife operating alone. The air knife assembly (referring to FIG. 1) will come to the left edge of platen 92, and push into collection pan or sink 98 all polymer removed from the letter-press plate. The thus collected polymer drains out of sink 98 via drain 112 to further collection means (e.g., a bucket or to waste.) The air pressure is then turned off in hose 84. The blotting assembly is disengaged from the letter-press plate by one of the two methods already described, i.e., by removing the plate or by cranking the blotting assembly upward (cf. FIG. 2). The motor is now reversed, and the assembly returns to its starting position, leaving the relief printing plate. At this point it is preferred to expose the plate to ultra-violet for about a minute to cure the thin film of liquid polymer remaining on the printing surface, and also to harden the total relief image. The plate can then be used immediately, e.g., as a relief printing plate in a regular printing operation in the known way.

The following examples will aid in explaining the preparation of a specific photopolymer, but should not be deemed as limiting the instant invention. Unless otherwise noted, all parts and percentages are by weight.

EXAMPLE 2

Tetraene prepared by reacting tolylene -2,4-diisocyanate with trimethylol propane diallyl ether, viz.:

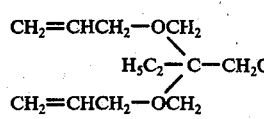 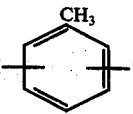 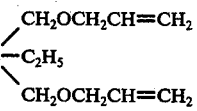

A round-bottom flask is fitted with a stirrer, thermometer, dropping funnel, nitrogen inlet and outlet. The flask can be placed in a heating mantle or immersed in a water bath as required.

Two moles (428 gms.) of trimethylol-propane diallyl ether were mixed with 0.2 cc. of dibutyl tin dilaurate under nitrogen. One mole of tolylene —2,4- diisocyanate was added to the mixture, using the rate of addition and cooling water to keep the temperature under 70° C. The mantel was used to keep the temperature at 70° C. for another hour. Isocyanate analysis showed the reaction to be essentially complete at this time. An antioxidant, 0.6 gms. of 2,6-di-tert-butyl-p-methylphenol was added to prevent vinyl polymerization.

EXAMPLE 3

One mole (602 gms.) of the tetraene prepared by the procedure of Example 2 was mixed with one mole (488 gms.) of pentaerythritol tetrakis-3-mercaptopropionate and 15 gms. of benzophenone. This mixture when layered to the prescribed thickness, e.g., about 20 mils, cures very rapidly in ultraviolet light to give a hard, strong product. It makes excellent relief printing plates.

EXAMPLE 4

A curable composition was prepared by the procedure of Example 3 except using the following exposure sequence. A suitable mold for making a printing plate was prepared using a 4-mil thick subbed Mylar film, i.e., subbed poly(ethylene terephthalate) commercially available from Anken Chemical and Film Corp., as a support with a 35-mil thick rubber electric tape stuck thereto about its edges in order to form a frame to contain the liquid curable polymer. The mold was leveled on an adjustable flat table and the curable composition at a temperature of 70° C. was poured into the mold along the edge of the frame and distributed evenly throughout the mold by means of a doctor blade. This technique produces a sufficiently flat surface and plate thickness tolerance of ± 1 mil. An air space of 7 mil thickness between the curable composition and a negative was maintained by means of shims at four corners of the frame. A line negative glued to a photographic grade glass plate with a thin film of the curable composition was placed on the shims with the emulsion side of the negative facing down toward the curable composition. The air space between the top level of the curable composition and the negative was maintained at 7 mils during the exposure.

The curable composition was exposed through the negative to actinic light from a 4000 watt Ascorlux pulsed xenon arc printing lamp, commercially available from Berkey Photo, Inc., placed 30 inches above the glass plate. The exposure was for 2 min., 15 sec., during which time the curable composition gelled in the image areas. The nonimage areas remained a liquid of essentially the same viscosity as before exposure.

After exposure the negative was removed and the uncured portion of the curable composition was removed in accordance with the herein described invention, using the air knife, with and without the blotting system.

The thus-formed plate was given an additional one-minute exposure to the ultra violet lamp using the above described exposure apparatus to harden the plate further and was then mounted on a newspaper press using double-face pressure-sensitive tape for adhesion to a printing saddle. Printing was carried out in the same way conventional metal photoengraved plates are employed. The printing results obtained were superior to those with conventional stereotype plate.

EXAMPLE 5

In this example the exposed plate was passed manually under a stationary air knife. Air input, at about 3 psig and 100 cubic feet/min. was applied to both ends of an air knife 48 inches long, 3.7 inches inside diameter, and having an air gap 20 mil wide. In some of the runs a blotting system was used, and in others it was not used.

The air stream impingement angle to the plate was approximately 40° with a distance from the knife outlet to the plate of approximately 1/32 of an inch.

An exposed plate was secured to a dimensionally stable backing plate and then moved through the air stream at various rates, either once or several times. It was observed that the uncured polymer was pushed or rolled away from the cured image, producing essentially a relief image plate. Several plates were printed using a rotary letterpress. Good to excellent results were noted.

A 20 mil thick 21½ inch × 14 inch polymer image area with a polymer weight of 154 grams was prepared using the procedure of Example 2.

Each plate was air knifed three times with dwell time required to move the 14 inches of plate through the air knife. The results of the following table were noted.

TABLE 1

| Plate No. | Temperature° F | Air Knife Dwell | % Non-Image Polymer Removed |
|---|---|---|---|
| 1 | ambient | 1.5 minutes | 84.5 |
| 2 | 180 – 200 | 1.5 minutes | 84.5 |
| 3 | ambient | 20 seconds | 80.0 |
| 4 | ambient | 20 seconds | 98.0 |

The results indicating percentage by weight removal of non-image polymer are significant when it is appreciated that the polymer is half viscous and difficult to remove.

EXAMPLE 6

Figure 8:
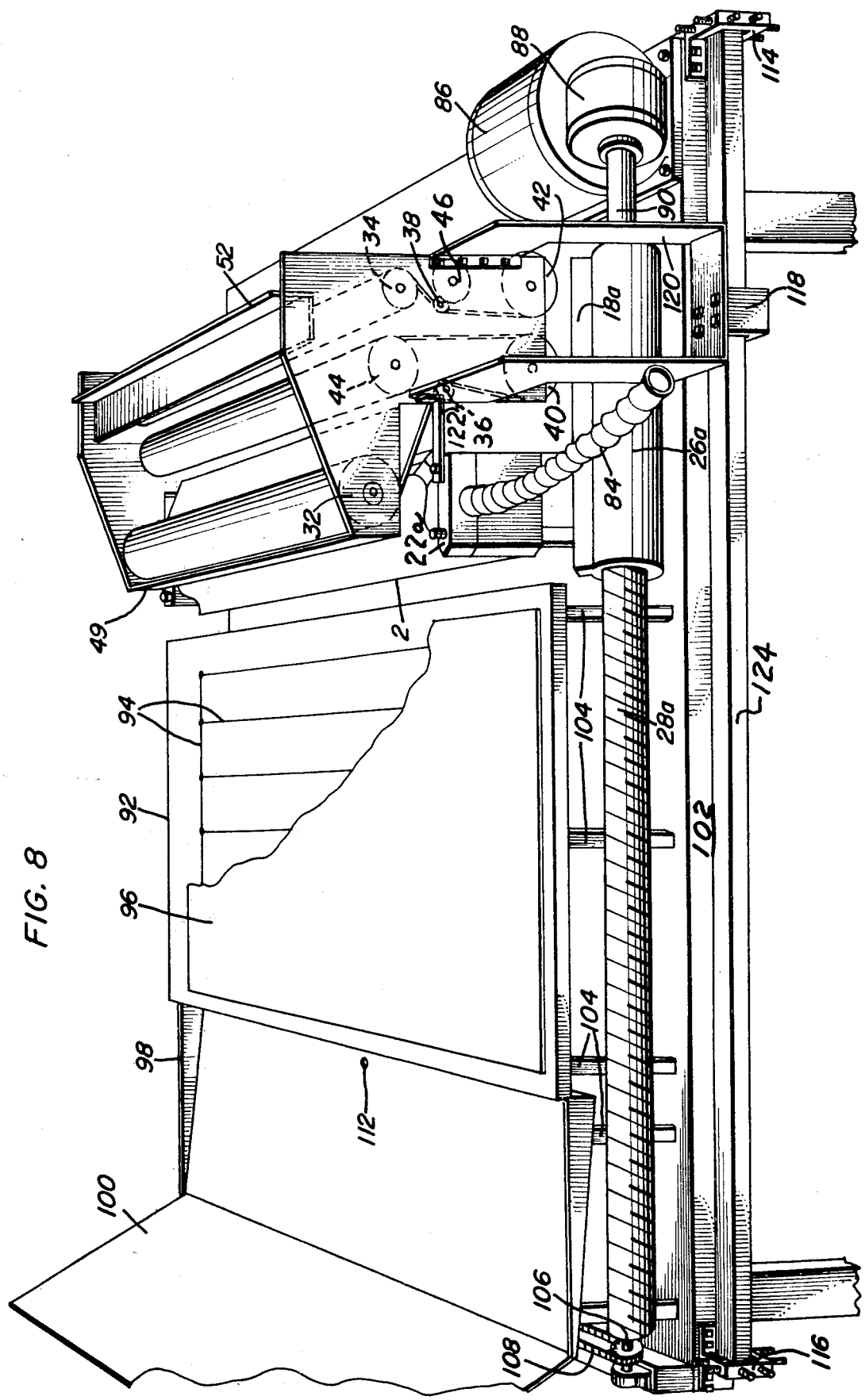
FIG. 8 shows an embodiment in which the weight of the blotting system is carried out on guide rails.

A preferred embodiment of the invention is shown in FIG. 8. In this figure the entire weight of the blotting assembly rests not in cylindrical support 26a, but rather upon guidebar 124. Guidebar 124 is attached by means of brackets 114 and 116 to the ends of frame 102. A slide support 118 slides on guidebar 124. Slide support 118 rests on ball bearings (not shown) to provide a substantially frictionless passage along guidebar 125. On the upper surface of slide support 118 there is affixed a U-bracket 120, the arms of which are attached to the sides of face plate 50, which in turn is connected to air knife support 22a by a metal strip, 122. Thus the air knife, being both carried and driven by cylindrical support 26a, tows behind it the entire blotting assembly during the blowing operation. In returning to the starting position the air knife pushes the blotting assembly. An advantage of this embodiment is that less weight is put on worm drives 28a and 28b, thereby reducing any tendency to warp. However, with a worm drive of large diameter such tendency would be negligible in any case. In this modification it will be noted that the rolls 40 and 42 will of necessity be substantially fixed in position. (Which is to say, the blotting assembly cannot be cranked up and down as it can in FIG. 2.) Since these rolls move by frictional contact with the surface of the printing plate, at the end of the blowing passage, the plate should be removed, e.g., by pulling it back under and away from the assembly of the air knife and blotting system, before the assemblies are returned to their starting positions. Otherwise, if the plate is left in position on the platen 92, the blotting rolls will be run backwards as the assemblies are returned to the starting position. This is of no great disadvantage, but it does mean that additional surface will have to be rolled up on the takeup rolls 44 and 46 before further passage of the assemblies can be made.

EXAMPLE NO. 7

A plate suitable for air-etching is made in this Example.

The apparatus used in this run was a so-called "Letterflex I Machine" sold commercially by W. R. Grace & Co. and in wide use in the United States. This machine includes several basic unit pieces of apparatus. The primary unit is the exposure tower. The exposure tower includes a platen, a glass frame negative holder, an ultra-violet ray source, and a system for dispensing the polymer and spreading it out by a doctor blade mechanism. The platen is an aluminum casting containing an indentation etched on its surface and connected to a vacuum source, for holding a plate on the platen, as later described. Underneath the platen is a bank of infra red lamps to insure that the platen is maintained at a constant temperature. The negative holder assembly comprises a sheet of Pyrex glass with a peripheral vacuum grid. The assembly also includes a transparent overlay sheet of clear plastic which can be a polyester.

The negative is sandwiched in between the glass plate and the plastic overlay. The glass plate is carried in a metal frame. The negative carrier assembly is hinged in journals at its rear so that it can be lifted up for insertion of the negative, then lowered over the platen.

The first step is to insert the negative between the glass plate and the plastic overlay of the negative carrier. Secondly, the operator places the plate backing (which is sold commercially as a gold color aluminum sheet, ten mils thick) on the platen. This sheet has been treated with a conversion coating of a known type followed by a resin coating, for improved adherence of the ultimate coating of photopolymer described hereafter. To insure complete flatness of the negative within the plastic overlay, and to make contact with the glass plate, the operator may roll a squeegee over the surface of the negative assembly. He may perform a similar squeegee operation on the plate backing when it is placed on the platen. Independent vacuum systems operate to cause the negative to cling closely to the glass plate, and the aluminum plate backing to cling closely to the platen.

The actual holding means of the negative against the glass plate is the plastic overlay, which is itself held by the imposed vacuum.

The negative assembly, still in its upright position, now moves toward the operator. A series of dispensing nozzles in a linear tube at the front of the assembly now dispense photopolymer, for example, that mixture described in Example 3 above. A linear puddle of photopolymer is fairly precisely metered out. The negative assembly now moves back to its starting position, while simultaneously doctor-blading the deposited puddle of photopolymer into a film having a uniform thickness of 20 to 23 mils, the thickness depending on the choice of the operator. The back strip is then removed. Protecting doors in the front of the assembly are now closed to protect the operator from the UV light which will now be turned on. Initially the plate is given a UV "bump" exposure as is customary in the Letterflex trade, to eliminate a phenomenon known as "cupping" or dishing. The phenomenon, if permitted, results in a concave characteristic in certain of the larger relief letters. The use of the bump exposure prevents later development of this undesirable feature. The bump exposure is typically 1 – 1½ seconds. The doors are now raised, and the operator hinges the negative assembly down on the platen containing the plate. At this point it must be observed that the negative assembly is not in contact with the photopolymer, which is to say, there is an air gap of 13–18 mils between the surface of the photopolymer and the bottom surface of the plastic overlay. This air gap is maintained by shims around the outer edge of the glass.

The doors are closed again, and the UV source is turned on for a predetermined time period (the main exposure), which depends upon the ultimate use intended for the printing plates. In a typical case, for newspaper plates, this main exposure is about 30–60 seconds.

The UV light now turns off automatically, the doors are raised, and the operator lifts the negative holding assembly. The resulting plate is now ready for development with the air knife in accordance with the process and apparatus of this invention.

The above description is a summary, with minor modifications, of the apparatus and process described in U.S. Pat. No. 3,597,080. A plate made in accordance with the patent (e.g., at Column 8, line 68) can be etched with the air knife of this invention in lieu of the procedures given in that patent for removal of unexposed liquid composition.

Figure 9:
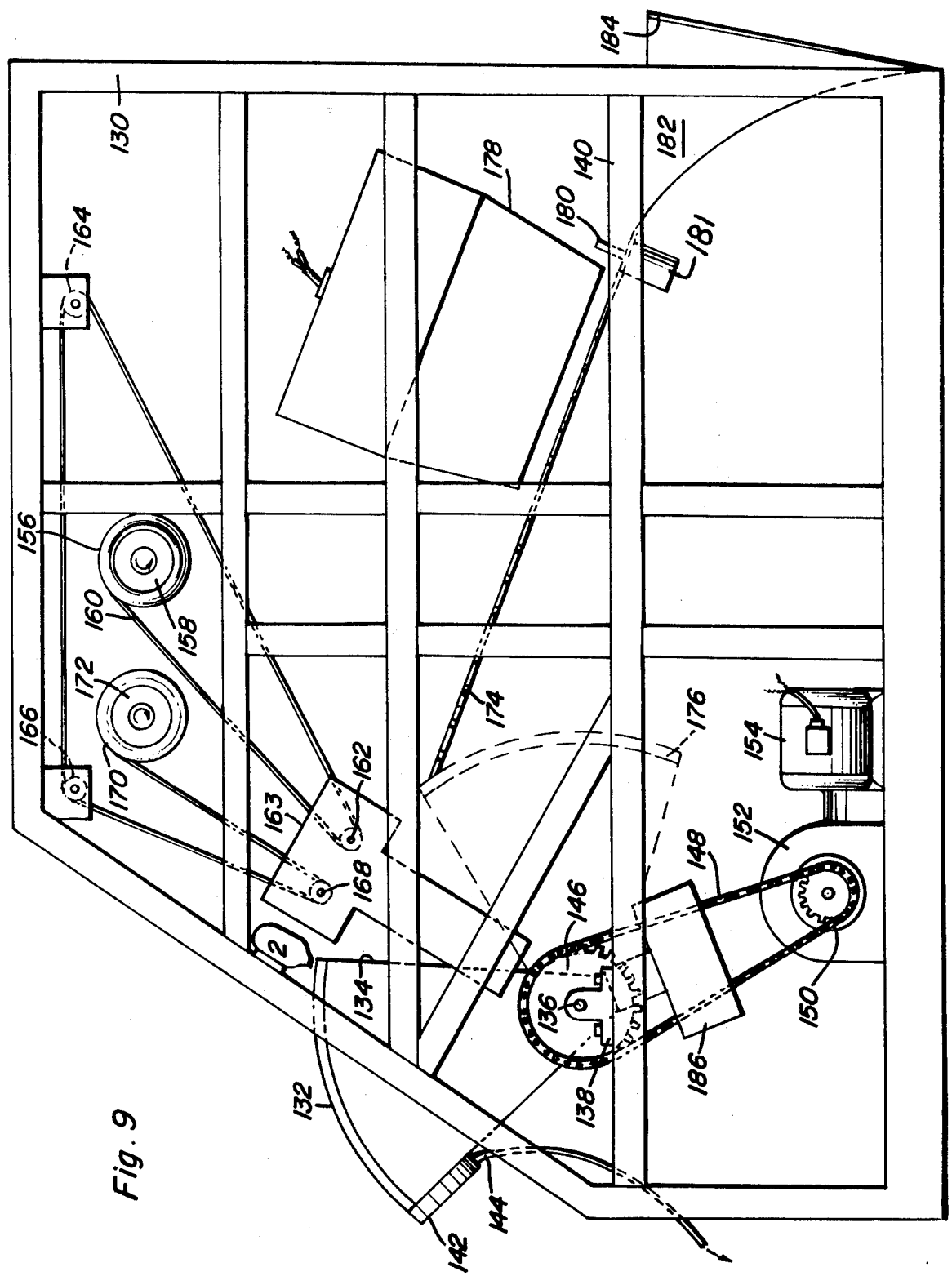
FIG. 9 shows an embodiment of the invention in which a platen is supported on an arcuate frame and passes under an air knife.

FIG. 9 shows a particularly preferred embodiment of an apparatus for using the air knife of this invention. At 130 is shown generally a frame comprising cross bars and vertical and horizontal girders to support the various components making up the air knife machine. The air knife itself is shown at 2, and this particular air knife is substantially identical to that shown in the preceding figures. The platen 132 is carried on a wedge-shaped support 134, which in turn pivots on an axle 136 supported by journal 138, which in turn rests on horizontal crossbar 140. On the trailing edge of the curved platen 132 is attached sink 142, which exits via a flexible tube 144 which leads to waste. The support 134 is affixed to shaft 136 which in turn is affixed to sprocket gear 146, which is driven by chain 148 connected to sprocket gear 150 which is operated by gear reducer 152 driven by electrical motor 154. A feed roll of paper is shown at 156 mounted on core 158. Paper 160 feeds to pressure roll 162, passes around idler roll 164, to second idler roll 166, down and around second pressure roll 168 and finally to takeup roll 170 mounted on core 172. Pressure rolls 162 and 168 are mounted in pressure roll bracket 163 (see detail, FIG. 13).

In operation an exposed plate ready for removal of uncured photopolymer is placed on platen 132. The vacuum source is turned on to hold the plate securely to the platen. Then motor 154 is activated, the air pressure on the air knife 2 is turned on, and the platen 132 moves forward under the air knife. The air knife blows out the uncured liquid photopolymer, and it collects as a ridge of fluid material in front of the air knife until the platen 132 passes completely under the air knife, whereupon all excess liquid polymer is blown into collecting tank 142 where it exits to waste via tube 144. Toward the beginning of this cycle, when the leading edge of platen 132 approaches pressure roll 168, both pressure rolls 168 and 162 are activated to approach the platen, moving downward to make this contact. (See FIG. 13.) At the same time the entire blotting system is activated so that the core 172 turns to pull paper through the blotting system, core 158 turns to release paper to the system, and pressure rolls 168 and 162 turn to give the same tangential velocity as the platen moving under them. Pressure rolls 168 and 162 are substantially identical to pressure rolls 40 and 42 of FIG. 1. The vacuum grid system of the platen 132 has three vacuum exits, 211, 213, and 214. These are each connected independently to a vacuum source. After the leading edge of the platen 132 passes under pressure roll 162, the vacuum is released in exit 211. Following this there is considerable air leakage, permitting the leading edge of the printing plate to disengage from the platen 132. Next in sequence the vacuum is released in exit 213, permitting further release of the printing plate, and finally the vacuum is totally released in the remaining vacuum exit 214, permitting the plate to disengage completely and to slide down chute 174. At the final position of platen 132 as shown by the dotted lines at 176, the printing plate has completely separated and has passed down the roller chute 174. Further events on the chute are determined by whether the plate receives post exposure within the framework of this machine, or whether post exposure is administered to the plate at another location. If post exposure is used in this machine, the post exposure unit should be positioned approximately as shown at 178. When a post exposure unit is used, the plate must be held by some means under the unit. We use plate stop 180. After the plate has been postexposed, plate stop 180 releases, and the printing plate, now ready for use, drops into receptacle 182 with back 184.

Plate stop 180 is operated automatically by air pressure cylinder 181. The plate stop 180 is raised by air pressure at the proper time in the sequence to retain the printing plate on roller chute 174 under post exposure unit 178. Following post exposure, plate stop 180 retracts into its pressure cylinder, and the printing plate slides on down the chute 174 into receptacle 182. Actually there are a pair of plate stops 180, but the one on the far side is not shown.

As soon as the platen reaches position 176, electric motor 154 reverses and returns the platen to its original starting position. During the return step rolls 168 and 162 lift slightly to permit the ready passage of the platen 132.

All of these steps are preferably programmed as to sequence and duration, by devices readily available in the electrical arts. However, all the steps can be carried out by hand, if desired.

In operating this particular machine, it has been found that about 40 seconds is adequate to remove undeveloped polymer from the plate. The platen can be returned to its starting position much faster than this, after the plate separates from it.

For ease of operation a counterweight 186 is suitably attached to support 134 to provide a substantially perfect balance between the platen assembly and the counterweight on the opposite side of the pivot journal 138.

Figure 10:
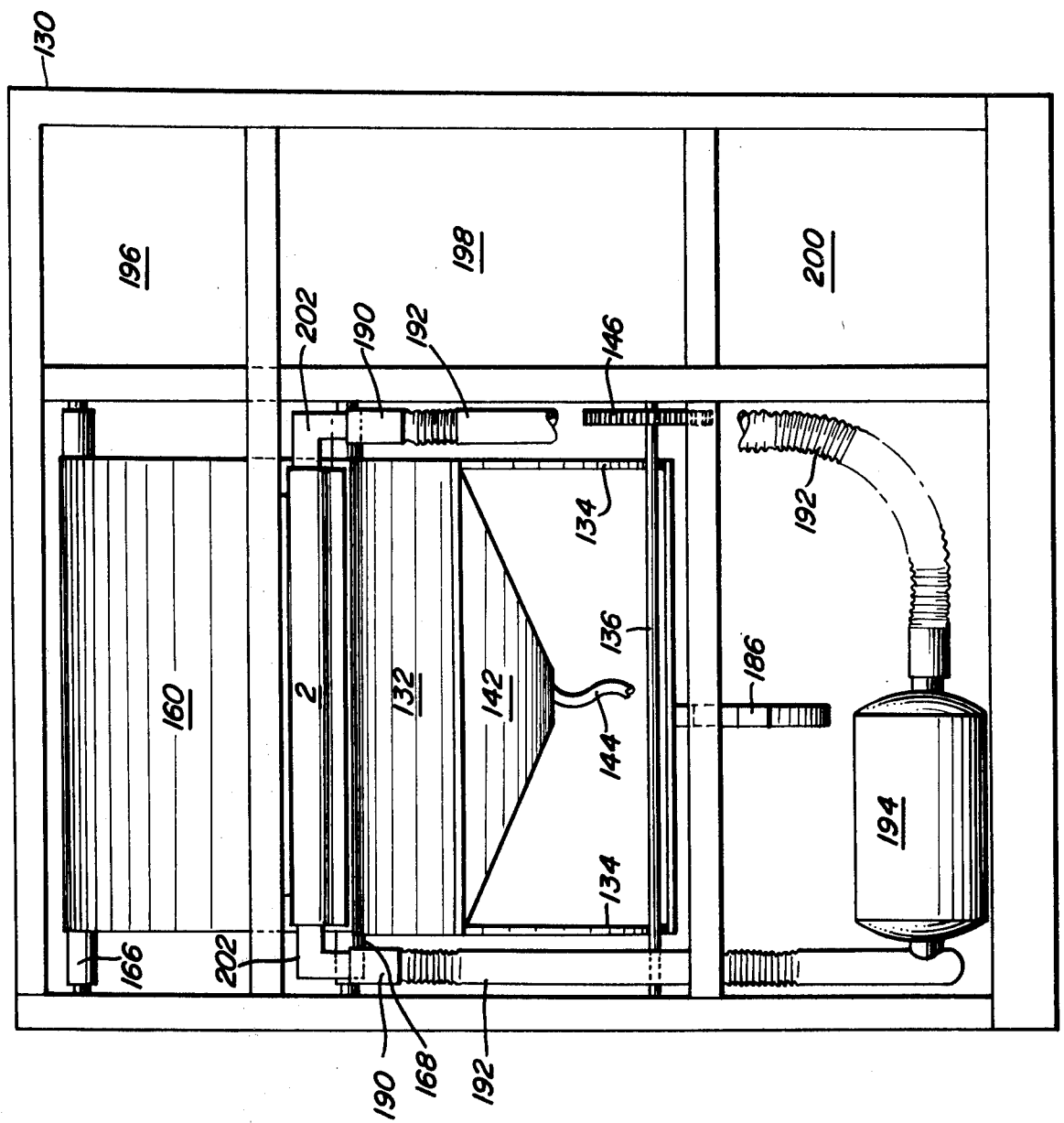
FIG. 10 shows the front elevation of the apparatus of FIG. 9.

FIG. 10 shows the front elevation of the machine of FIG. 9. The air knife is shown at 2. This is connected to side inlets 202. These inlets 202 are connected to frame 130 by support means (not shown). Thus the air knife remains stationary during the operation. Inlets 202 are in turn connected to heater elements 190. Optionally these heater elements may be omitted, depending on the viscosity of the photopolymer, as herein described. If heater elements ae used they are followed by flexible connections 192 which feed air from an air pump (not shown) located in space 200. Typically a muffler 194 may be interposed between the air pump and the air knife 2. The air pump is activated at the beginning of the cycle and is turned off after the platen 132 completely passes under the air knife 2. The spaces 196, 198, and 200 provide for the use of auxiliary equipment useful in the operation of the machine. In 196 may be installed motor and driving means for core 172 which serves only to maintain tension on the paper and provide for take up of used paper. Rolls 162 and 168 are driven simply by frictional contact with the printing plate on platen 132. In 198 may be conveniently placed the programming system of relays which activates and deactivates each element of the machine at the proper time and in the proper sequence. In 200, as shown, may be placed drive means for the air knife support system.

Figure 11:
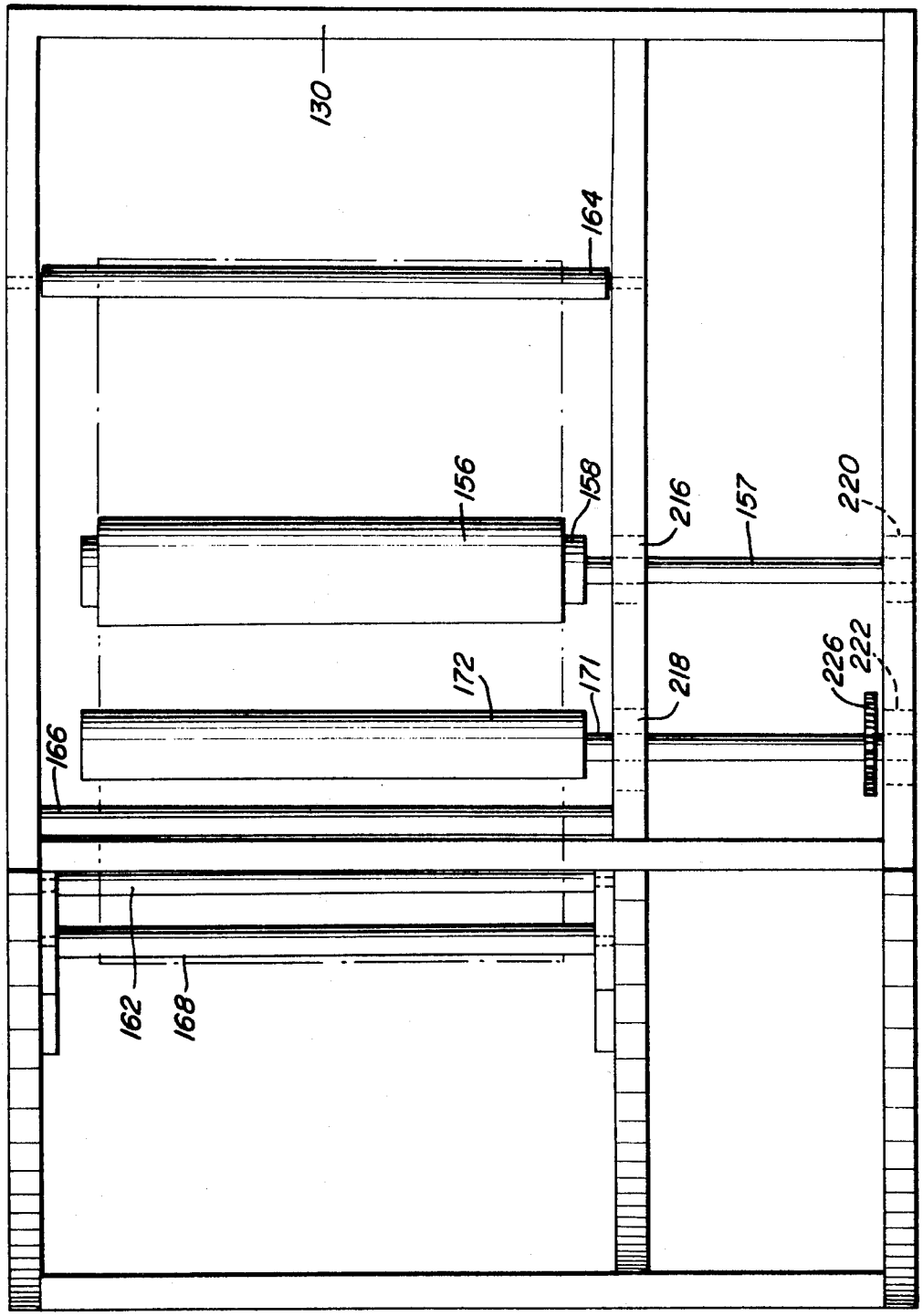
FIG. 11 shows a plan view of the apparatus of FIG. 9 limited to the six rollers involved in the blotting system.

FIG. 11 shows a plan view of the machine of FIG. 9. This view, however, is limited to showing the framework and the disposition of the six rollers involved in the blotting system.

The feed roll of blotting paper is shown at 156. This is carried on a core 158 which is supported by means of shaft 157. This shaft is journaled at 216 and 220. A leather drag rests on the journal 157 to provide tension. The web of paper from 156 goes around pressure roll 162, then around idler roll 164, then around second idler roll 166. Core 172 has a shaft 171 rotating in journals 218 and 222. It is driven by spur gear 226.

Figure 12:
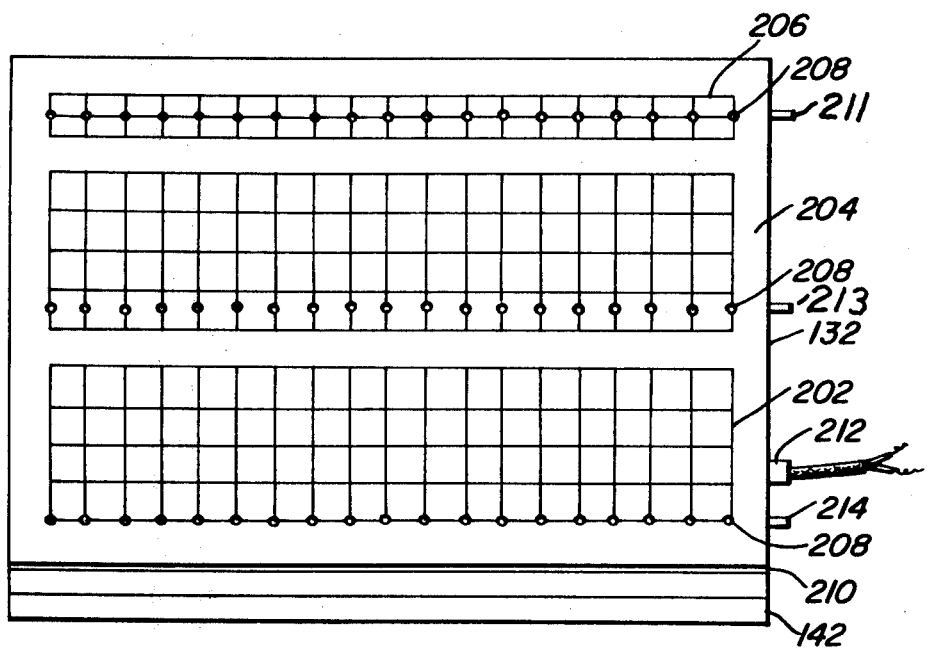
FIG. 12 is a plan view of the platen of FIG. 9.

FIG. 12 shows the platen 132 in a plan view. Vacuum grids are shown generally at 202, 204, and 206. This vacuum grid is readily made by boring slots laterally into the side of the platen, followed by vertical borings as shown at 208, and with a final crosshatch grinding to provide a grid. Optionally a slot may be provided at 210, toward the trailing edge of the platen 132, to prevent any polymer from creeping under the trailing edge of the printing plate back into the vacuum grid system. The platen may be heated by electrical resistance, and this will require an electrical input as shwn generally at 212. The vacuum grid is evacuated via exits 211, 213, and 214.

Figure 13:
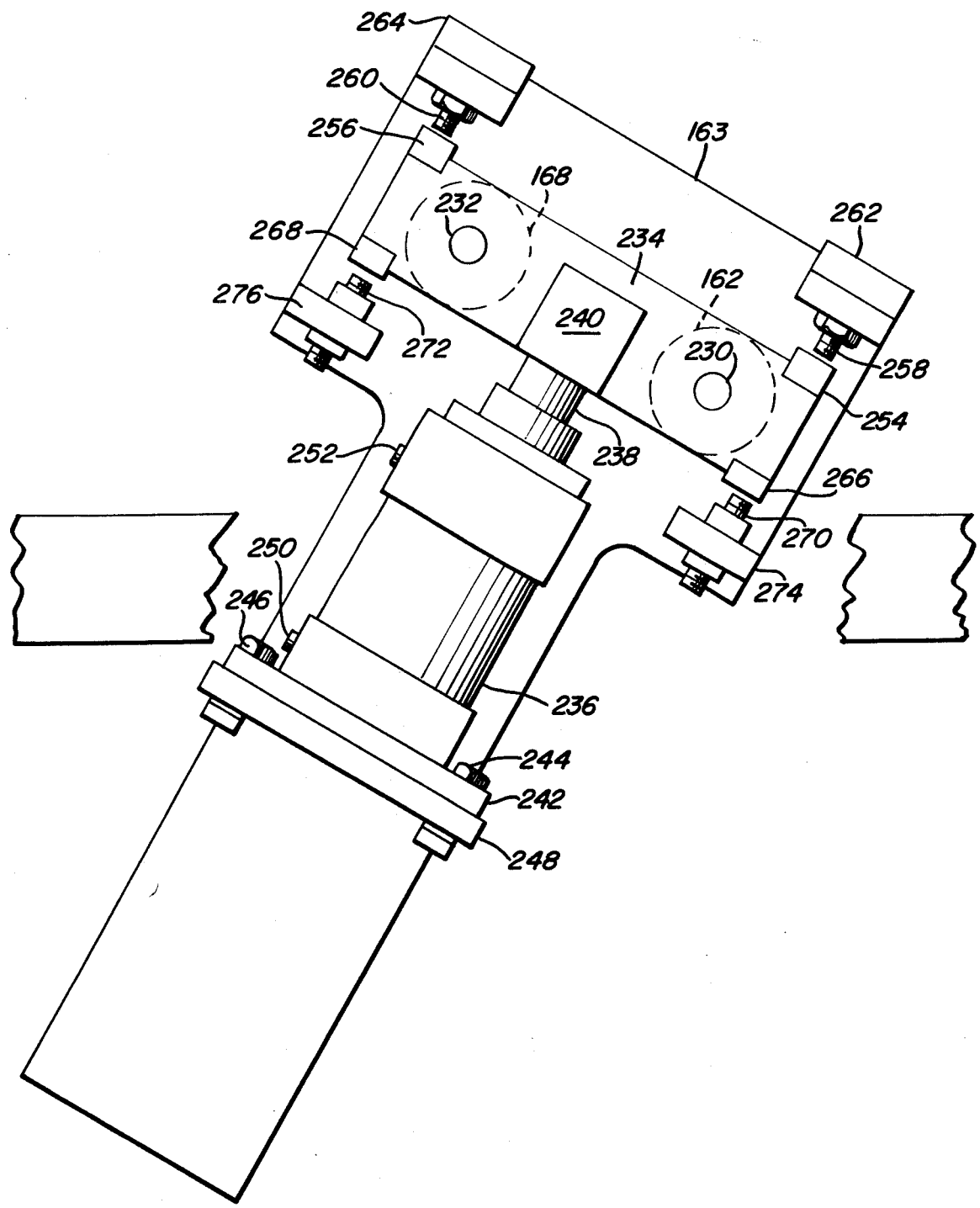
FIG. 13 shows the detail for the operation of the means whereby the blotting rolls are moved to and from the platen assembly of FIG. 9.

FIG. 13 shows the orientation of the pressure roll bracket 163. The pressure rolls 162 and 168 are carried in journals 230 and 232 respectively. These journals are in turn carried in journal block 234. At 236 is shown generally an air pressure cylinder. This cylinder carries a piston (not shown) which in turn activates rod 238, which is affixed into rod-containing block 240, in journal block 234 where cylinder 236 is supported on a bracket system shown generally at 242. This bracket system is connected to pressure roll bracket 163 by nuts and bolts 244 and 246 connecting the base of the air cylinder 242 to bracket 248, the latter being affixed to member 163. The cylinder 236 carries entrance and exit air ports 250 and 252 respectively. In operating the cylinder, air is taken from a compressed air supply (not shown), and is led to port 250 via a flexible pressure resistant hose, not shown. This causes the piston to rise, and forces rod 238 upward. Rod 238 in turn carries the entire journal block 234 upward and with it the pressure rolls 162 and 168. Upward movement ceases when stops 254 and 256 encounter the bottoms of bolts 258 and 260. These bolts are mounted in brackets 262 and 264. In operating the air knife machine, the rolls are moved upward when the platen 132 returns to starting position, so that the blotting paper will not contact the surface of platen 132. This upward movement is preferably about ⅛ inches. After the platen has returned to starting position, a new plate is placed thereon, and the air knife 2 is again activated, the cylinder 236 is programmed to receive air in inlet port 252 (via an air pressure hose, not shown), which builds up pressure on the upper side of the piston and moves rod 238 downward, along with journal block 234 and rolls 162 and 168. Downward movement ceases on contact of the stops 266 and 268 with the tops of the bolts 270 and 272. These bolts are fixed in brackets 274 and 276. After the platen 132 has passed under the roll assembly, the cylinder releases air at 252 and receives it again at 250. Thus the cycle repeats.

In operating the machine of FIG. 9, the air knife generally blows a spray of polymer particles to the front. To avoid contact of operating personnel with this spray, we prefer to place a transparent screen (e.g., a sheet of Mylar) in front of the machine. Alternately, the entire front can be enclosed in glass or metal walls, and the spray allowed to impinge on the walls. In this connection, if it is desired that sprayed polymer not drip down the enclosing walls, U.V. lamps can be brought to bear on the sprayed areas to cure the polymer in situ.

If the machine of FIG. 9 is to be programmed for automatic operation, we first enclose the front of the machine with panels including a lift-up door for ready access to the platen. (This is to control polymer spray.) An electrical circuit is then provided to operate in association with the following steps.

The access door is opened, which in turn automatically activates the leading edge vacuum and main platen vacuum.

Load plate on platen.

Vacuum sensors sense full vacuum and turn the creep elimination air flow on, and blotting rollers are activated to go into the down position.

Close the door. At this point the "ready" light should show on the panel. Push start button.

Platen begins to move. Air knife blower comes on once the leading edge of the platen passes the air knife opening. Platen motion continues and blotting rollers press down on plate and platen. The system goes through two blotting rollers, primary and secondary. The leading edge vacuum in the platen is released, then the positive air pressure turns on in the leading grid. The plate releases from the platen and starts unloading into the unload rack. The air knife blower turns off ½ inch before the end of the plate. Platen motion continues until the plate unloads. Plate goes into post exposure position if that position is empty, and if it is not empty the plate stays in a hold position. The plate goes into post exposure when the latter position is free, whereupon a sensor triggers the post exposure light. When the light comes on a stop goes up, preventing additional plates from coming in to the post expose position. Next, the post exposure light goes off and the rear stop comes down. The plate slides out. The rear stop comes up again. The forward stop comes down. If there is a plate in the waiting position it slides down into the post expose position. As soon as the plate is unloaded off the platen, the platen automatically goes back to the loading position. One is now ready to open the door again and start the whole process all over again.

AIR FLOW FROM THE AIR KNIFE

The air flow from the air knife must be sufficient to remove liquid polymer but not so great as to dislodge the cured relief characters. Between these two extremes a considerable variation is possible and operable. The air knife as shown in the Figures in this specification is typically maintained at 1/32 inches from the surface of the plate being etched. Air flow delivered to the hose is typically 100 CFM at 6 psig. When beginning a new polymer formulation, or when starting to use a new air knife, it is a simple matter to run the air knife over a few test plates, varying air pressure, air spacing, and temperature, until good working values are found. Such values are typically within the range 3–18 psig for the air pressure delivered to the air knife, and 0.005 to 0.075 inches for the spacing of the lips 12. (The air knife described in the above Examples had a gap of 0.015 inches.)

The lips of the air knife should be fairly close to the surface to the plate being etched, but should not touch the plate. A spacing of about 1/64 inches to ⅛ inches is suitable, and about 1/32 inches is preferred. A spacing greater than ⅛ inches can be used, but the air pressure has to be increased, and there may be considerable spattering of the polymer.

To be removed uncured liquid polymer, the air knife must deliver air in a plane at an angle to the plane of the letter-press plate. This angle is variable, but in the general case an included angle in the range of 20° to 90° is suitable. The angle of the air knife as shown in the drawings in this specification is 70° (which is preferred).

The air knife shown in the drawings is a simple elongated cylinder, providing a linear air flow (or sheet, or curtain) which is transverse to the work direction. This results in moving substantially all of the uncured liquid photopolymer ahead of the air flow to the far end of the platen for collection. However, this is but one of a number of ways of shaping and using the air knife. It may, for example, be wedge- or plow-shaped, or convex forward, whereby polymer will be blown not only to the front, but also to both sides of the platen. It can also be concave.

The rate of passage of the air knife over the letterpress plate is variable, and depends somewhat on the air pressure in the air knife, the gap between the lips 12, angle of the air knife, and the viscosity of the photopolymer. It is an easy matter to try different speeds on a few test plates, with a view to finding the fastest speed that will consistently carry off all the polymer. In Example 1 the speed was 0.5 inch/second. Speeds as high a 3 inches/second and as low as 0.25 inch/second are operable and suitable. Even lower speeds are operable, but consume valuable time and apparently do not remove additional polymer.

As shown in FIGS. 1–8, the platen is stationary and the air knife moves over it. In an alternate (Cf. FIG. 9) the air knife is stationary and the platen moves under it. In another embodiment (not shown) both the platen and the air knife move, of course toward each other, and the plate is picked up after passage.

The platen can be flat or it can be shaped as part of a cylinder (convex or concave), and the air knife and blotting systems adapted to guides and drives of the same curvature.

If desired, the apparatus may be operated vertically; which is to say, the platen is perpendicular to the floor, and the air knife and blotting system move down the letterpress relief plate, pushing the uncured polymer downward to collection means. This modification offers advantages where floor space is at a premium.

Sundry means are available for moving the air knife (and blotting assembly) relative to the platen, or viceversa. Such apparatus, having a plate slidably movable on a frame and adapted to move under the air knife, may include means to move the platen under the air knife and to return the platen to its starting position. In addition to the worm drive shown, a simple endless chain drive is suitable. Also, hydraulic or compressed air drives can be used. In such cases, the moving element can be supported on guide rails such as those shown in FIG. 8.

We have indicated that the working air stream forming the air knife should be a continuous slot or plane of air. A preferred form of air knife producing such a stream of air is shown in the air knife of the drawings. Actually any form of air flow which gives the equivalent of a continuous slot or plane of air is included within this concept. A discontinuous stream such as would be provided by series of widely spaced air holes would give a poor plate because the polymer would not be completely removed in the areas between the holes. However, if discontinuities in the stream were negligible and/or overlapping so as to clear off all the polymer in a line across the plate (leaving only a thin film), then such an air knife would be fully operable and within the spirit, scope, and concept of this invention.

Thus, the terms "knife-like sheet" and "as a sheet" when used herein to describe the air stream from the air knife, can include discontinuities such as would result from holes and grills; and tiers or banks of slits, slots, and gaps (whether parallel to or slanted toward each other); always provided that in the aggregate they give the effect of a continuous flow of vapor across the printing plate.

As we have mentioned the use of the air knife leaves a thin film of uncured photopolymer over the surface of the printing plate. Even after blotting the film remains in the depressed areas of the plate, i.e., within the interior of the characters, between the characters, and between the dots of the half-tones. The presence of this film gives an improved plate, as compared with similar plates developed by the ultrasonic liquid etch process. This improvement is particularly apparent in developing the so-called "combination" plate with both halftone images and characters (e.g., regular type letters). In the older system, in exposing such a plate, in order to get good half-tones it was necessary to make a somewhat longer exposure than was optimum for the characters. In other words, in order to expose fully for the dots of the half-tones, the characters had to be somewhat overexposed. This meant that the characters were necessarily broader in section and somewhat coarse in appearance.

On the other hand if the exposure was shortened to give the optimum time for the characters, the dots of the half-tones would be underdeveloped. That is to say, in the liquid etch system, the correct exposure for dots (in the half-tones) might be typically 60 seconds. This would give dots having bases with upswept curves and with a fair amount of polymer fill between the bases of the dots. Such configuration represents a good profile for dots. The lines and characters however would have somewhat thickened bases and would tend to print perceptibly coarser than lines exposed for less time, say 45 seconds (which exposure time would in the typical case give a clear crisp line or character with a narrower cross-section and base). On the other hand, in the wet etch system, if the dots are exposed for only 45 seconds (assuming comparable conditions throughout), then the dots will lack breadth at their bases, and will tend to be weak and spindly. Furthermore, the surface diameters of such dots tend to be perceptibly reduced compared to surface areas of dots exposed for, say, 60 seconds. Using the dry air knife system, exposure for the same time (say 45 seconds) would give dots having upswept polymer around the base and full surface diameters, and in other ways resembling the dots obtained at 60 seconds using the wet etch system.

In practicing the prior art wet etch process, of which this invention is an improvement, a compromise was generally made so that the characters were slightly overdeveloped (but were passable) and the half-tone areas were slightly underdeveloped (but were passable). With the new air knife system of this invention it is possible to make a much better compromise. The film left by the air knife between the dots in the half-tone areas has the effect of providing additional "development" by the mere physical act of filling in between the dots. Inter alia, the film anchors the dots to the substrate. As it turns out, in the general case the half-tone dots are closer to their optimum development with the same exposure time used to bring the characters to their optimum development. Thus the quality of the plate per se is directly and immediately improved. And it is a consequence of the phenomenon of this balanced exposure, that exposure times for a given combination plate are substantially reduced, compared with times required for the old liquid etch system. The reason for the shorter exposure time is that as soon as the characters are fully developed, the exposure can be stopped, since the half-tones are also developed within this time. In the old process the exposure would have to be continued until the half-tones were developed to an acceptable level. The savings in exposure time has been found to be of the order of 25 percent. This is extremely important in the production of a newspaper.

A further advantage of the thin film left by the air knife, as has been found in many instances in the operation of this invention, is that it (the thin film) blends into the bases of the characters and the half-tone dots in the shape of upswept curves to strengthen the characters and dots, and as a consequence providing a more stable printing plate, one capable of making more printed impressions than plates not so stabilized.

THE BLOTTING SYSTEM

The blotting material in the blotting system is not critical, the reason being that most liquid photopolymers will stick to anything simply on contact. We prefer plain butcher paper, which is cheap, readily available, and adequately absorbent. Other types of paper (whether more or less absorbent) can also be used. Also, the web may be fabric (cotton or synthetic), felt, or synthetic polymer, such as Mylar polyester, polyethylene, cellophane, and the like. In one very simple embodiment, the letter-press plate is "blown" manually with a hand-held air knife, and then a sheet of photo blotter is pressed down by hand on the plate. This procedure takes longer and requires more care, but the results are excellent.

The blotting webs need not be rolled up. Instead, continuous webs can be used. These are replaced when they are no longer able to absorb polymer.

As we have mentioned the air knife can be used alone or in association with a blotting system. Although we prefer to use it with the blotting system, a commercially acceptable printing plate can be made with the use of the air knife alone. When this embodiment is used (elimination of the blotting system) we prefer to use a plate that has been initially photo-imaged without the use of the "bump" exposure above referred to. If the letter-press plate carries only large size lettering and is free of half tones, the blotting system can in many cases be omitted, regardless of whether the plate has been subjected to a bump exposure.

WARMING THE PLATEN

In some cases it may be desirable to warm the platen, for the purpose of reducing the viscosity of th uncured photopolymer, thereby to facilitate its removal from the plate. The platen can be warmed by various means, e.g., circulating a warm or hot fluid (air, water, steam) through a grid in or under the body of the platen; or by an electrical resistance coil in or under the body of the platen. When this embodiment is used, the platen should not be heated to a temperature so high that the cured areas of the letter-press plate are deformed. A little experimentation will establish an upper limit for a given photopolymer. A temperature within the range room temperature to 200° F. will generally be found operable in most cases.

The photopolymer made as described in Example 2 is a little too viscous for use without warming. Accordingly, the platen and air flow were warmed to about 180° F., so that the polymer would have a viscosity of about 200 centipoises, which viscosity is preferred for use with the air knife of this invention. The air knife can, however, be used suitably with polymers having viscosities of 100 14 10,000 centipoises. When the polymer is viscous at room temperature, it is nevertheless suitable if it can be rendered sufficiently liquid by warming the platen and/or air stream up to 200° F., preferably 120° – 190° F. The temperature should be adjusted to aim at a viscosity of 100 – 10,000 cps., and preferably about 200 cps.

In rare cases, e.g., where the polymer is too liquid at room temperature (has a viscosity below 100 cps. at start), it is desirable to chill the platen and/or the air stream to increase the viscosity so that under working conditions it is in the 100 – 10,000 cps. range.

In alternate embodiments, the air knife can be warmed, or the air that enters the air knife can be warmed, in each instance to provide a similar temperature range. In a preferred embodiment, both the platen and the air to the air hose are heated.

THE PHOTOPOLYMER

Substantially any liquid photopolymer is operable in this invention. In addition to those already mentioned, those described in U.S. Pat. No. 3,556,791 of Jan. 19, 1971, are also useful. The nature of the photopolymer is not critical, so long as it will make a letter-press relief plate by providing cured areas and uncured areas. The latter areas in all cases readily blown out by the air knife system of this invention.

Another suitable liquid photopolymer was prepared by mixing together 350 g. styrene, 650 g. of a typical unsaturated polyester resin, for example poly(ethylene maleate/phthalate), and 15 g. benzoin methyl ether as photoinitiator. Still another suitable liquid photopolymer was made by mixing 100 parts of diethylene glycol diacrylate and 1 part of benzoin as photoinitiator. Both of these liquid photopolymers require exposures of the order of five minutes. Other liquid photopolymers are well known to those skilled in the art.

The photopolymer can actually be a solid at the outset if it can be liquefied by warming (i.e., to a temperature in the range of 70°–200° F.) to a viscosity in the range of 100 to 10,000 centipoises.

As we have indicated, our preferred photopolymer for use in this invention is the polyene-polythiol type described in U.S. Pat. No. 3,661,744. Such photopolymers, complete with photosensitizer (photocuring rate accelerator) are commercially avaible from W. R. Grace & Co. When polyenepolythiol photopolymers are referred to herein, it will be understood that those disclosed in the aforesaid patent are meant.

Numerous variations are possible in operating this invention. In one very simple embodiment the air knife slides on rails. The action is entirely manual. The operator simply pushes the air knife assembly across the platen at the desired speed, thereby turning the blotting rolls by friction. Or, even more simply, after the air knife is retrieved, the operator simply lays down a sheet of blotting paper on the letterpress relief plate and blots residual liquid photopolymer therefrom by hand.

Air is of course the cheapest gas for the air knife, and the simplest to use. However, other gases are suitable, e.g., nitrogen, carbon dioxide, argon, helium, and the like. Even combustible gases can be used, with adequate safeguards. None of these gases offer advantages over air. When the term "air knife" is used herein, it is to be understood that the term applies to elongated apparatus delivering gas as a thin sheet.

What is claimed is:

1. Apparatus comprising, in combination
   1. a first frame;
   2. an air knife assembly comprising
      a. a second frame affixed to the first frame,
      b. an air knife carried in said second frame, said air knife consisting of an elongated hollow chamber containing a slit adapted to deliver air under pressure as a thin sheet;
      c. means to deliver air under pressure to the air knife; and
   3. A platen carried movably on said first frame and adapted to hold a relief letterpress plate having liquid polymer thereon; said platen carrying a sink on at least one of its sides to collect liquid blown from said plate by said air knife;
   4. drive means adapted to move the platen under the air knife assembly in a work direction and to return the platen to its starting position.

2. The apparatus of claim 1 in which the platen comprises heating means.

3. The apparatus of claim 1 comprising means for heating the air delivered to the air knife.

4. The apparatus of claim 1 which contains a blotting assembly affixed to the first frame, adapted to blot the letter-press plate after it has passed under the air knife, comprising at least one blotting system comprising elements:
   1. a supply roll of blotting web;
   2. a pressure roll adapted to press said blotting web against the letter-press plate; and
   3. a take-up roll adapted to roll up used blotting web.

5. The apparatus of claim 4 in which the air knife assembly comprises an additional pressure roll.

6. The apparatus of claim 4 in which the pressure roll is operably connected to means for raising and lowering it.

7. Apparatus comprising, in combination
   1. a stationary frame;
   2. a platen carried on said frame and adapted to hold a relief letter-press plate having a liquid polymer thereon;
   3. a sink on at least one side of the plate, to collect liquid blown from said plate by the air knife below referenced;
   4. an air knife assembly comprising
      a. a movable frame adapted to move over the platen;
      b. an air knife carried in said movable frame, said air knife consisting of an elongated hollow chamber containing a slit adapted to deliver air under pressure as a thin sheet at least as wide as the letter-press plate;
      c. means to deliver air under pressure to the air knife;
      d. a blotting assembly adapted to blot the letter-press plate after the air knife has passed over same, comprising at least one blotting system comprising:
         i. a supply roll of blotting web;
         ii. a pressure roll adapted to press said blotting web against the letter-press plate; and
         iii. a take-up roll adapted to roll up used blotting web; and
   5. drive means adapted to move said air knife assembly over the platen in a work direction and to return the assembly to its starting position.

8. The apparatus of claim 7 in which the air knife assembly comprises two blotting systems comprising said elements (1), (2), and (3).

9. The apparatus of claim 7 in which the pressure roll is operably connected to means for raising and lowering it.

10. Apparatus comprising, in combination
    1. a stationary frame;
    2. a platen carried on said frame and adapted to hold a relief letter-press plate having a liquid polymer thereon; the platen comprising heating means to assist in maintaining as liquid the polymer on the letter-press plate;
    3. a sink on at least one side of the platen, to collect liquid blown from said plate by the air knife below referenced;
    4. an air knife assembly comprising
       a. a movable frame adapted to move over the platen;
       b. an air knife carried in said movable frame, said air knife consisting of an elongated hollow chamber positioned at an acute angle to the platen surface and containing a slit adapted to deliver air under pressure as a thin sheet on the letter-press plate and the air knife slit being at least as wide as the letter-press plate;
       c. means to deliver air under pressure to the air knife; and
    5. drive means adapted to move said air knife assembly over the platen in a work direction and to return the assembly to its starting position.

11. Apparatus comprising, in combination
    1. a stationary frame;
    2. a platen carried on said frame and adapted to hold a relief letter-press plate having a liquid polymer thereon;
    3. a sink on at least one side of the platen, to collect liquid blown from said plate by the air knife below referenced;
    4. an air knife assembly comprising
       a. a movable frame adapted to move over the platen;
       b. an air knife carried in said movable frame, said air knife consisting of an elongated hollow chamber positioned at an acute angle to the platen surface and containing a slit adapted to deliver air under pressure as a thin sheet on the letter-press plate and the air knife slit being at least as wide as the letter-press plate;
       c. means to deliver air under pressure to the air knife;
       d. means for heating the air delivered to theair knife to assist in maintaining as liquid the polymer on the letter-press plate; and
    5. drive means adapted to move said air knife assembly over the platen in a work direction and to return the assembly to its starting position.

* * * * *

UNITED STATES PATENT AND TRADEMARK OFFICE
CERTIFICATE OF CORRECTION

PATENT NO. : 4,042,996
DATED : Aug. 23, 1977
INVENTOR(S) : Wessells and Pickard

It is certified that error appears in the above-identified patent and that said Letters Patent are hereby corrected as shown below:

At [63] on page 1, change "Continuation-in-part of Ser. No. 388,234" to read --Division of Ser. No. 388,234-- .

Signed and Sealed this

Second Day of May 1978

[SEAL]

Attest:

RUTH C. MASON
Attesting Officer

LUTRELLE F. PARKER
Acting Commissioner of Patents and Trademarks